(12) United States Patent
Wolf

(10) Patent No.: US 6,753,680 B2
(45) Date of Patent: Jun. 22, 2004

(54) POSITION SENSOR

(75) Inventor: Ronald J. Wolf, 51082 Straiford Ct., Elkhart, IN (US) 46514

(73) Assignee: Ronald J. Wolf, Elkhart, IN (US)

( * ) Notice: Subject to any disclaimer, the term of this patent is extended or adjusted under 35 U.S.C. 154(b) by 0 days.

(21) Appl. No.: 10/050,291

(22) Filed: Jan. 16, 2002

(65) Prior Publication Data

US 2002/0118011 A1 Aug. 29, 2002

Related U.S. Application Data

(63) Continuation-in-part of application No. 09/725,605, filed on Nov. 29, 2000, now abandoned.

(51) Int. Cl.[7] .................................................. G01B 7/14
(52) U.S. Cl. .............................. 324/207.2; 324/207.24; 324/207.25
(58) Field of Search ........................ 324/207.2–207.25; 338/32 R, 32 H

(56) References Cited

U.S. PATENT DOCUMENTS

| | | | |
|---|---|---|---|
| 4,810,965 A | 3/1989 | Fujiwara et al. ............ 324/208 |
| 4,970,463 A | 11/1990 | Wolf et al. ............... 324/207.2 |
| 5,045,785 A | 9/1991 | Hansen ................... 324/207.16 |
| 5,111,092 A | 5/1992 | Reinicke ....................... 310/68 |
| 5,332,965 A | 7/1994 | Wolf et al. ............. 324/207.12 |
| 5,757,181 A | 5/1998 | Wolf et al. ............. 324/270.12 |
| 5,811,969 A | 9/1998 | Kyodo ................... 324/207.16 |
| 5,818,223 A | 10/1998 | Wolf ..................... 324/207.12 |
| 6,018,241 A | 1/2000 | White et al. ............. 324/207.2 |
| 6,064,197 A | 5/2000 | Lochmann et al. ..... 324/207.14 |
| 6,211,668 B1 * | 4/2001 | Duesler ................... 324/207.2 |
| 6,515,473 B2 * | 2/2003 | Pfaffenberger et al. .. 324/207.2 |

* cited by examiner

Primary Examiner—Gerard R. Strecker
Assistant Examiner—Reena Aurora
(74) Attorney, Agent, or Firm—Taylor & Aust, P.C.

(57) ABSTRACT

A position sensor for sensing linear or radial position, including at least four magnets, a first ferrous plate having at least two of the at least four magnets located at spaced locations along the first ferrous plate, the at least two magnets being oriented such that a north pole of at least one of the at least two magnets is directed toward the first ferrous plate and a south pole of an other of the at least two magnets is directed toward the first ferrous plate, a second ferrous plate having at least two of the at least four magnets located at spaced locations along the second ferrous plate, the at least two magnets being oriented such that a north pole of at least one of the at least two magnets is directed toward the second ferrous plate and a south pole of an other the at least two magnets is directed toward the second ferrous plate, the first ferrous plate and the second ferrous plate being generally parallel and spaced apart and at least one magnetic flux responsive device disposed between the first ferrous plate and the second ferrous plate.

13 Claims, 21 Drawing Sheets

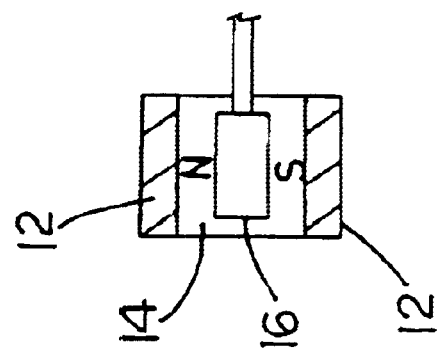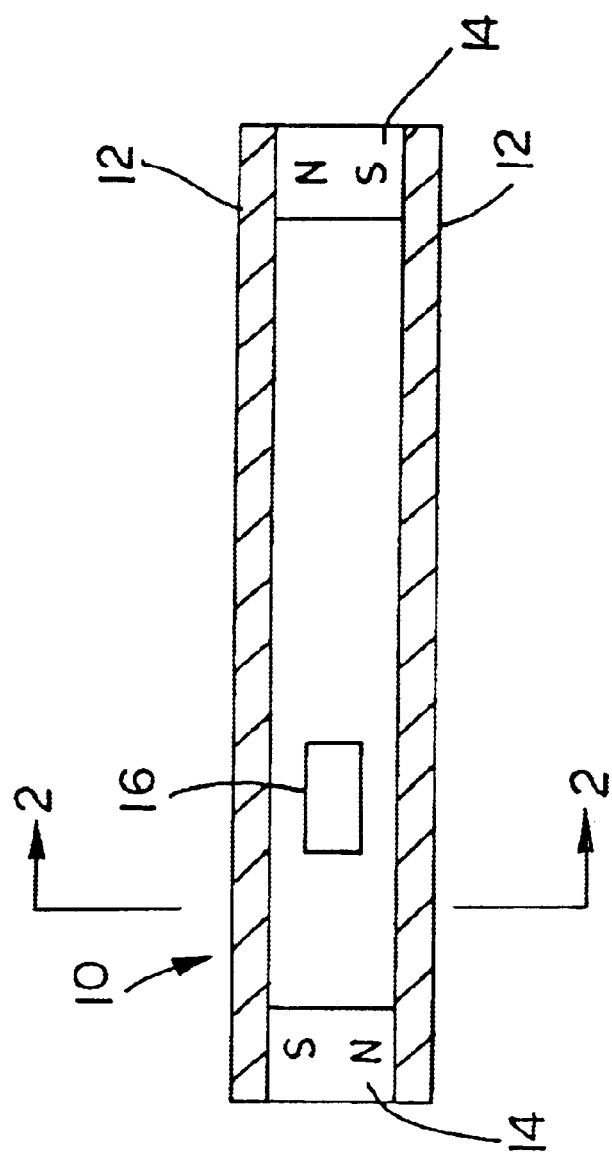

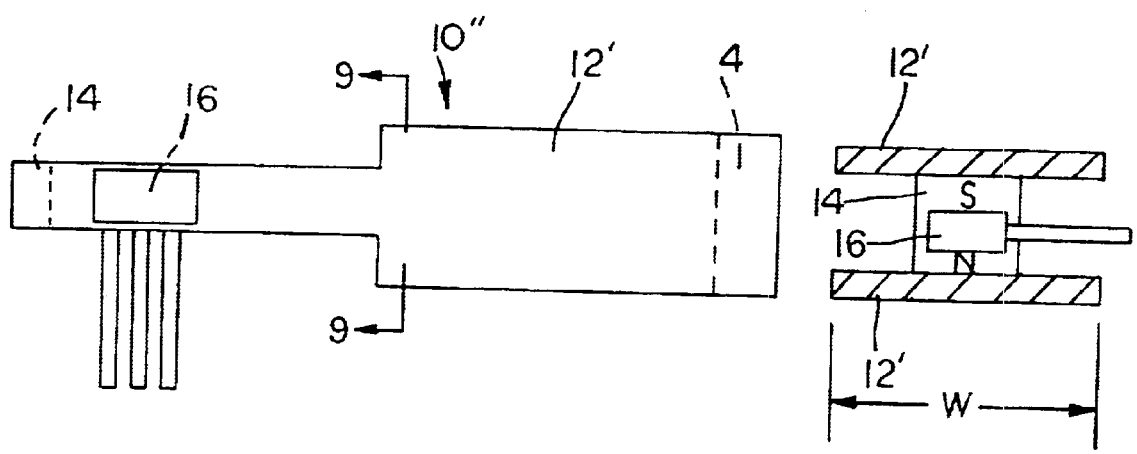
FIG.8
FIG.9
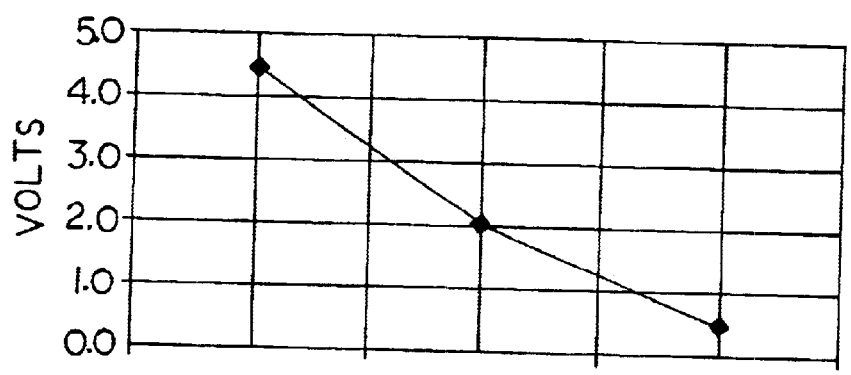
FIG.10

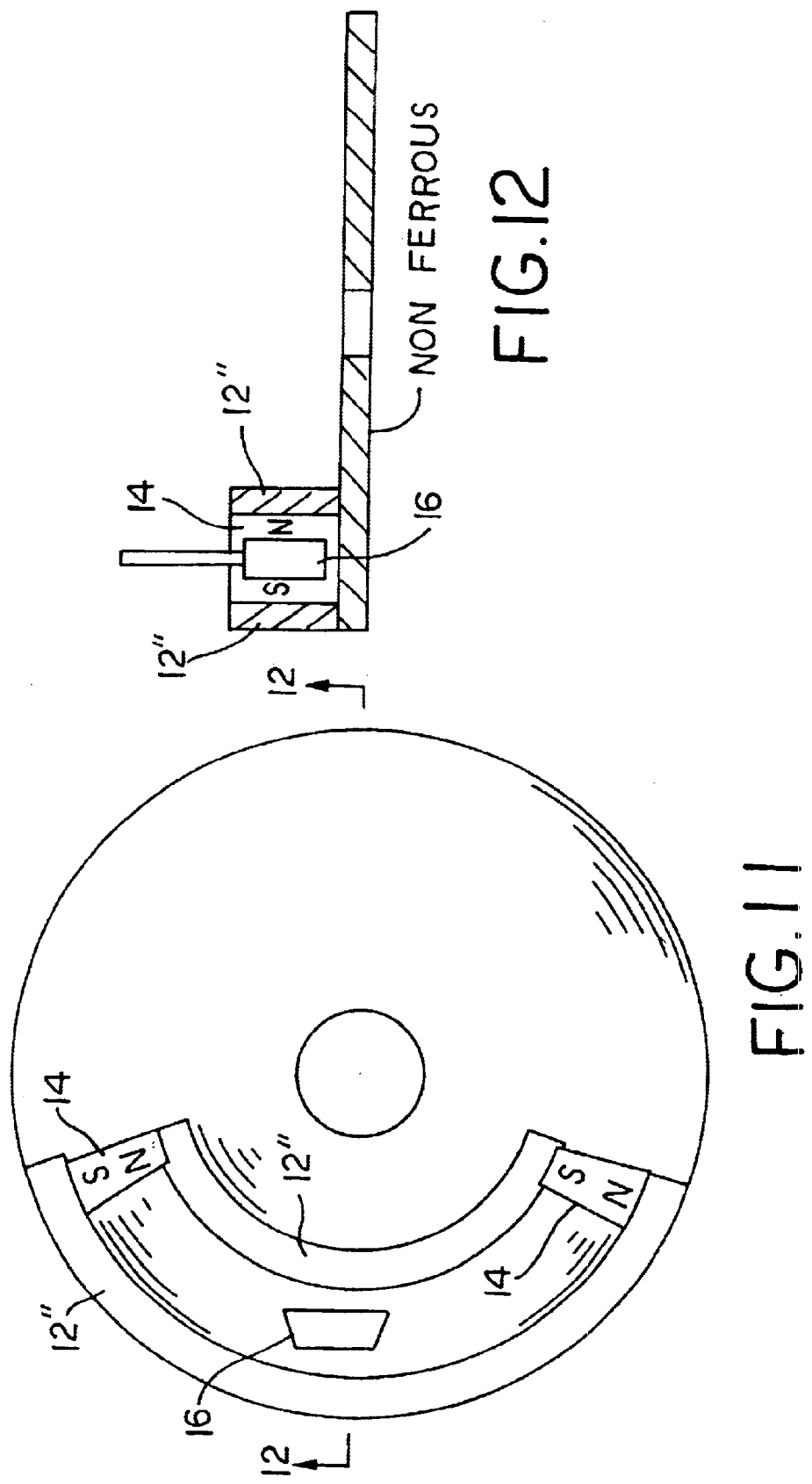

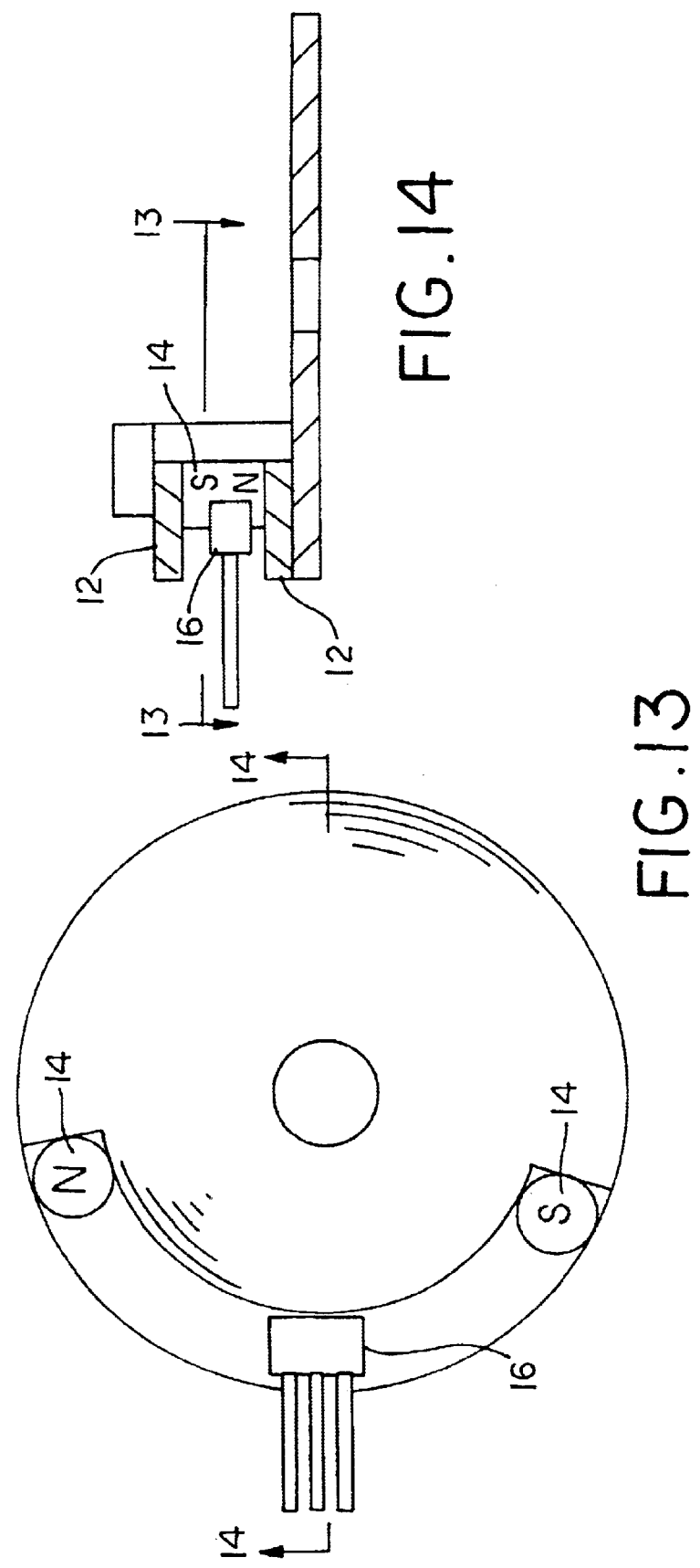

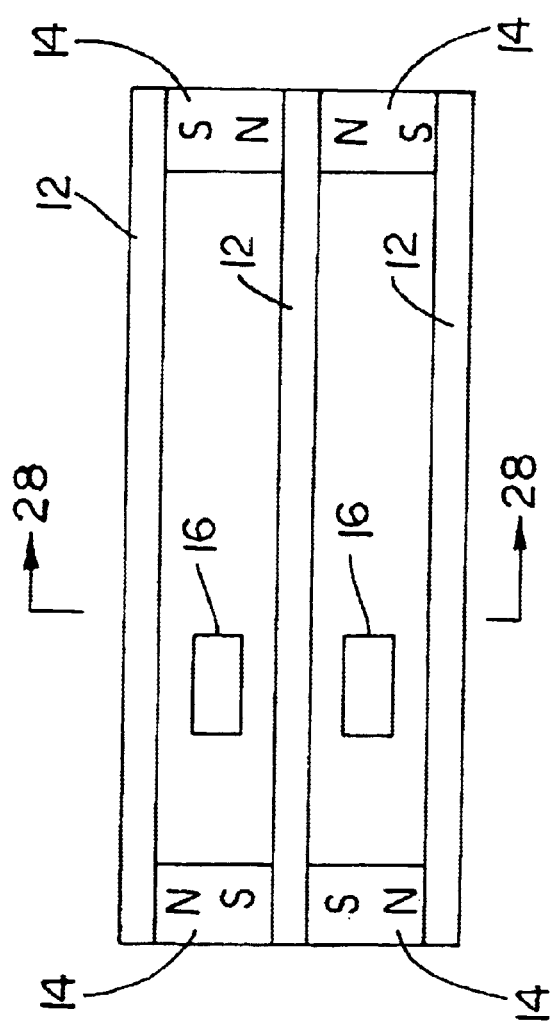
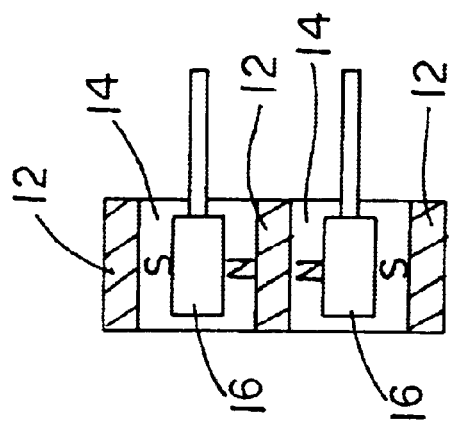

POSITION SENSOR

CROSS REFERENCE TO RELATED APPLICATIONS

This is a continuation-in-part of U.S. patent application Ser. No. 09/725,605, entitled "SENSOR FOR LINEAR AND RADIAL DISPLACEMENTS" filed Nov. 29, 2000 now abandoned.

BACKGROUND OF THE INVENTION

1. Field of the Invention.

The present invention relates to electromagnetic sensor assemblies, and, more particularly, to electromagnetic position sensor assemblies.

2. Description of the Related Art.

Electronic devices are an increasing part of everyday life and they are presently integrated in a large number of products, including products traditionally thought of as mechanical in nature, such as automobiles. To bridge the gap between mechanical movement and electronic control it is necessary to successfully integrate electronic and mechanical components. The gap is normally bridged by using devices such as sensors and actuators.

Position sensors are used to electronically monitor the position or movement of a mechanical component. The position sensor produces data that may be expressed as an electrical signal that varies as the position of the mechanical component changes. Position sensors are an important part of innumerable products, providing the opportunity for intelligent control of a mechanical device.

Various contact type sensors are known. For example, potentiometers are used which detect a change in an electrical signal due to the physical change in position of a wiping contact on a resistive element. Rotational position movement can be detected by coupling a shaft of a potentiometer to the shaft of a rotating mechanical component. Linear movement can be detected using either a liner potentiometer or a rotating potentiometer that is coupled to a linear moving component using pulleys and a string or a belt to translate a linear motion to rotational motion. A problem with this type of sensor is the physical wearing of the rotating part, the wiping contact and the resistive element cause a drift in the electrical signal and lead to ultimate failure of the device.

Magnetic position sensors are generally a non-contact type of sensor and consist of a magnetic field sensing device which is usually stationary and a magnet that is attached to a moving component. As the magnet approaches the sensing device the magnetic field of the magnet is detected and the sensing device generates an electrical signal that is then used for counting, display, recording and/or control purposes. A problem with such sensors is that they depend on movement of the magnet and they are not able to provide information as to the static position of a mechanical component.

Other magnetic position sensors provide an indication of the displacement of the mechanical component by using a magnetic field sensing device which reports the intensity of a magnetic field from a magnet which is positioned on the mechanical component. The magnet is positioned and the magnetic field sensing device is located relative to the magnet in such a fashion as to cause the magnetic field to vary in the magnetic field sensing device as the magnet moves. A magnetic field sensing device may detect a static magnetic field from the magnet and report the field strength as a representation of the position of the mechanical component.

A magnetic positional sensor developed by the inventor, patented as U.S. Pat. No. 5,818,223, entitled "ROTARY POSITION SENSOR WITH CIRCULAR MAGNET", discloses a Hall effect device disposed within a cylindrically shaped magnet. The magnet having a magnetic field that varies from a north pole to a south pole as detected along a circular face of the magnet. The cylindrical magnet is mounted to a rotatable mechanical component and a Hall effect device is positioned inside the cylindrical magnet with an air gap therearound. The Hall effect device has flux concentrators mounted thereto. The magnetic field produced by the cylindrical magnet is detected by the Hall effect device which in response thereto produces an electrical response representative of the magnet and hence the mechanical component's angular position.

A problem with such sensors is that they require large magnets.

Another problem with rotating sensors is that they require a stationary and a movable portion within a single assembly.

What is needed in the art is a compact modular position sensor which will provide static and moving position information using smaller magnets.

SUMMARY OF THE INVENTION

This invention relates to a position sensor which senses the linear or radial position of a mounted device. The sensor includes at least one elongated ferrous plate and a pair of magnets at spaced locations along the plate. An electronic signal generating device responsive to the flux density of the magnets along the plate is provided between the magnets with the plate being movable relative to the signal generating device.

Accordingly, it is an object of this invention to provide a position sensor which is of economic construction and which may sense the position of a mounted device either in a lateral orientation or a radial orientation.

It is another object of this invention to provide a position sensor which is for sensing the position of a mounted device and which allows a substantial relative movement between the mounted device and the sensor components.

A further objective of this invention is to provide a position sensor which utilized a Hall effect integrated circuit with the ability to sense either linear or radial movement.

Other objects of this invention will become apparent upon reading the following description.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 1 is a side view of one embodiment of this invention;

FIG. 2 is a sectionalized end view of the embodiment of FIG. 1;

FIG. 8 is a side view of a third embodiment of this invention;

FIG. 9 is a sectionalized end view of the embodiment of FIG. 8;

FIG. 10 is a graph showing in the horizontal axis the position of the Hall effect device in FIG. 8 relative to the ferrous plates of that figure and in the vertical axis the output signal strength of the Hall device relative to three positions of the Hall device;

FIG. 11 is a top view of another embodiment of this invention showing parallel curved plates;

FIG. 12 is a side view in form of the embodiment of FIG. 11;

FIG. 13 is a partial top view of still another embodiment of this invention showing curved plates;

FIG. 14 is a side view in sectionalized form of the embodiment of FIG. 13;

FIG. 27 is a side view of still another embodiment of this invention illustrating the use of three parallel plates interconnecting by magnets;

FIG. 28 is an end view in sectionalized form of the embodiment of FIG. 27;

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE INVENTION

Figure 3:
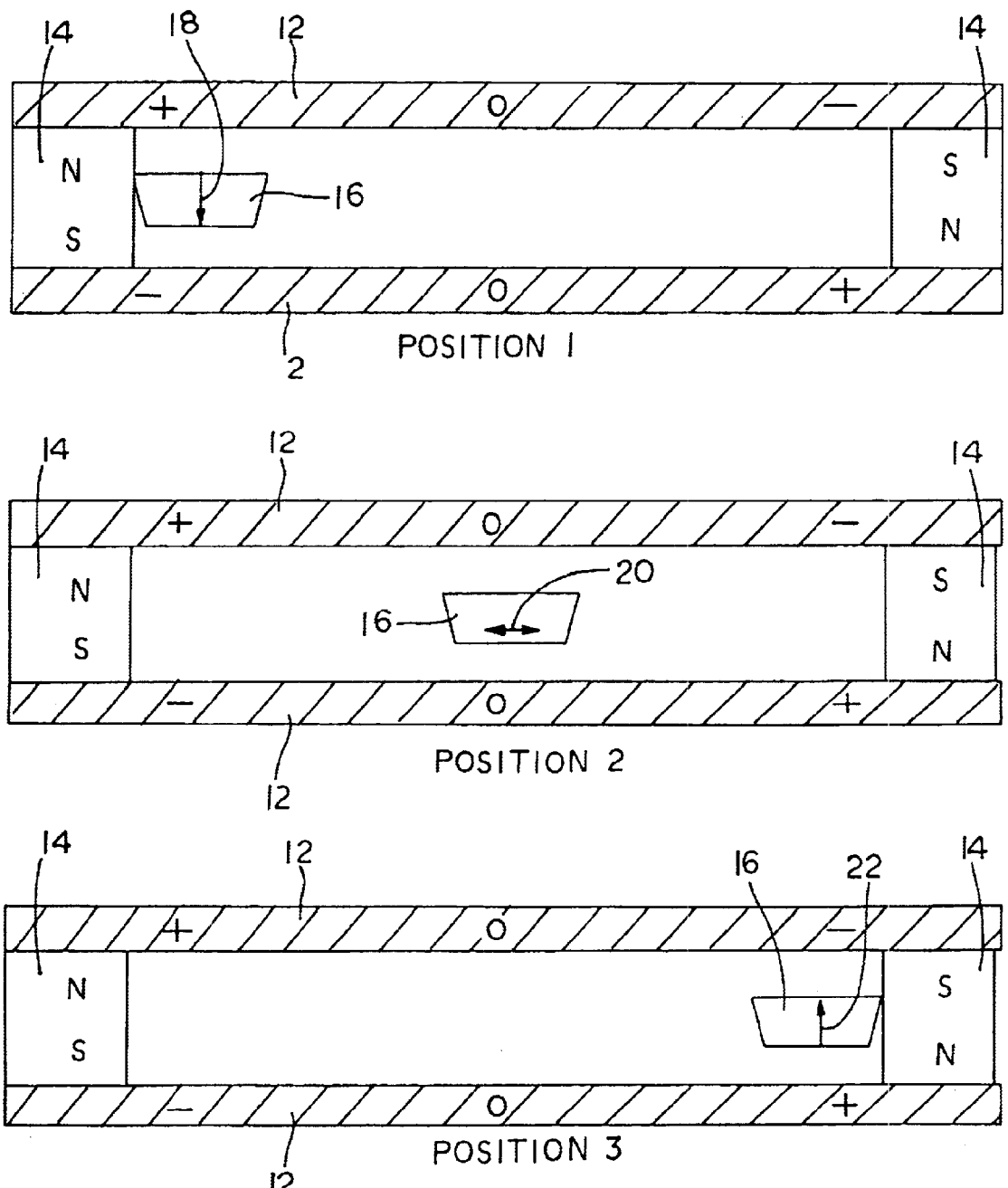
FIG. 3 is illustrative of three views of the embodiment of FIG. 1 showing the Hall effect device in three different operative positions.

This invention makes use of the principles generally stated in the U.S. Pat. Nos. 5,818,223; 5,757,181; 5,332,965; and 4,970,463. These patents are incorporated herein by reference.

Referring to FIGS. 1 and 2, position sensor 10 includes two low carbon ferrous plates 12 of preferably, cold rolled steel. A magnet 14 is located at each end of the ferrous plates 12 which are in parallel arrangement. Each magnet 14 includes a north and south pole and may be of the samarium cobalt type having an energy property of 22MGOe. Variations in the types of magnets and magnetic fields strengths along with different types of ferrous materials are within the scope of this invention. Located between plates 12 and also between magnets 14 is a magnetic flux responsive device 16 in the form of a Hall effect integrated circuit such as a Micronas Hal 805. Again, the type of magnet responsive device can vary with application.

In normal operation the integrated circuit 16 would be stationary while the connected ferrous plates 12 and magnets 14 would move relative to the integrated circuits such as when being used for displacement movement measures of foot pedals, throttle positions, EGR valves and headlight levering systems in automobiles. It is, though, possible in some applications that the magnetic assembly including the plates would remain stationary while the magnetic responsive or integrated circuit moves relative to the fixed plates. The integrated circuit 16 is connected to a suitable readout circuit. The use of dual plates 12 provide for more assembly variations, allowing less critical locations between plates for the integrated circuit.

In FIG. 3, movement of the magnets 14 and connected plates 12 relative to integrated circuit 16 is illustrated for 3 positions. With the north/south poles of magnets 14 being oriented as illustrated so as to be aligned perpendicularly to plates 12, position 1 of FIG. 3 shows the integrated circuit 16 located adjacent the left most magnet 14 as viewed in the figures with the magnetic field direction being illustrated as shown by arrow 18. As the relative movement between plates 12 and integrated circuit 16 takes place, integrated circuit 16 approaches a middle location as illustrated in position 2 of FIG. 3 in which a zero magnetic field is sensed by the integrated circuit. This is illustrated by arrow 20 in position 2. When further relative movement between the integrated circuit and plates occur with the integrated circuit now being located next to magnet 14 located at the right of the illustration as viewed in FIG. 3, the magnetic field direction is shown by arrow 22. Thus, in position 13, of FIG. 3 the magnetic field, illustrated by arrow 22, is at a maximum positive field illustrated by arrow 22.

Figure 4:
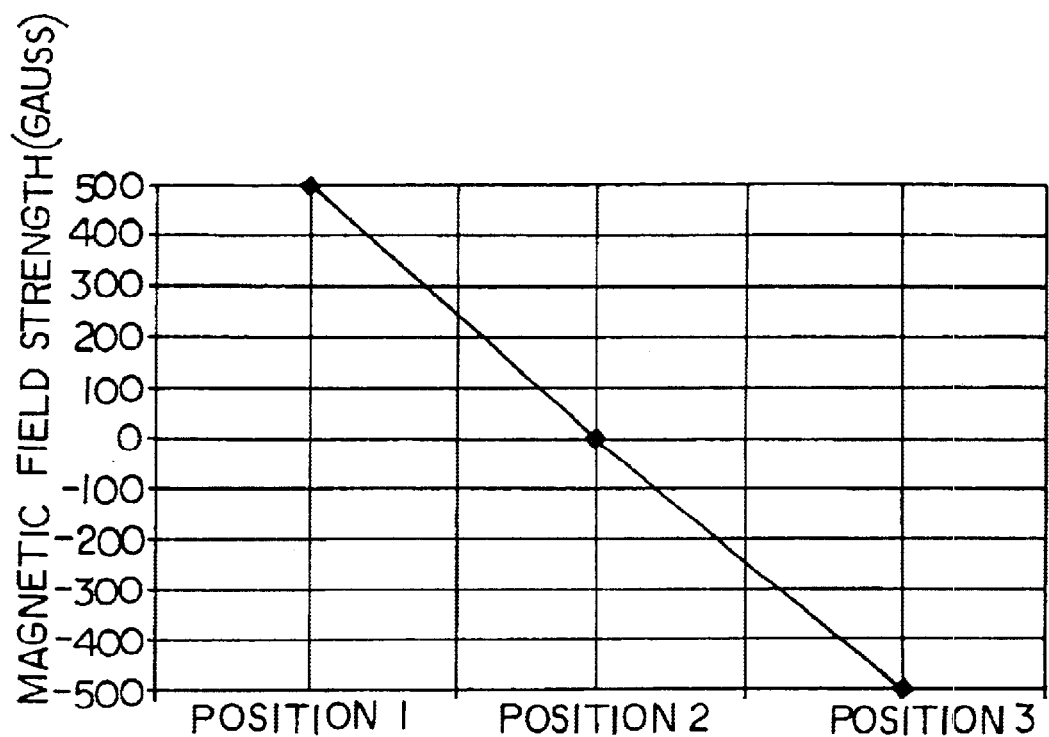
FIG. 4 is a graph showing in the horizontal axis the position of the Hall effect device relative to the ferrous plates and in the vertical axis the magnetic field strength that is sensed by the hall effect integrated in circuit relative to the positions shown in FIG. 3.

In FIG. 4, there is a graph illustrative of the magnetic field strength relative to the linear position or location of the integrated circuit relative to plates 12 corresponding to the position illustrative of a mid-position in which the magnetic field is zero or neutral.

Figure 5:
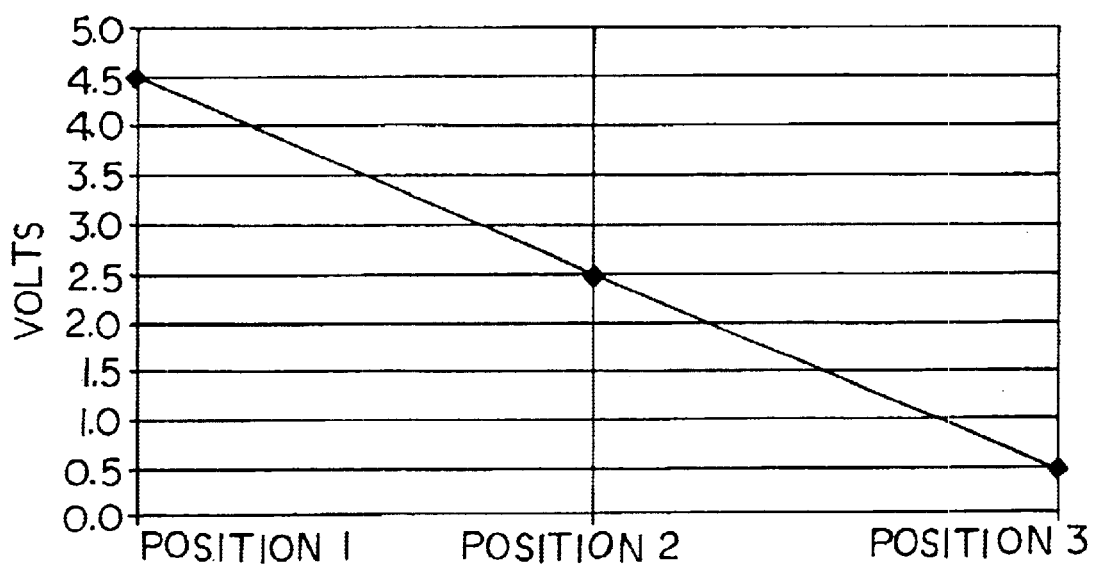
FIG. 5 is a graph showing in the horizontal axis the linear position of the Hall effect integrated circuit and in the vertical axis the output signal strength of the Hall effect device relative to the position as shown in FIG. 3.
Figure 7:
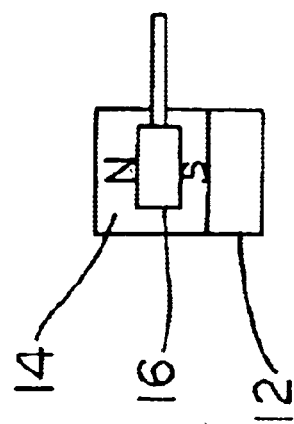
FIG. 7 is a sectionalized end view of the embodiment of FIG. 6.

In FIG. 5, the magnetic field strength sensed by the integrated circuit 16 is converted by the Hall effect device into a voltage output signal. This output signal can then be converted by appropriate well-known circuitry into a position that relates to a linear location between magnets 14. Although only three positions of the Hall effect device relative to plates 12 are illustrated for purposes of producing the charts in FIGS. 4 and 5, it is to be understood this relative movement is continued from side to side with the relative positions of the components being determined at any location of device 16 between magnets 14.

Figure 6:
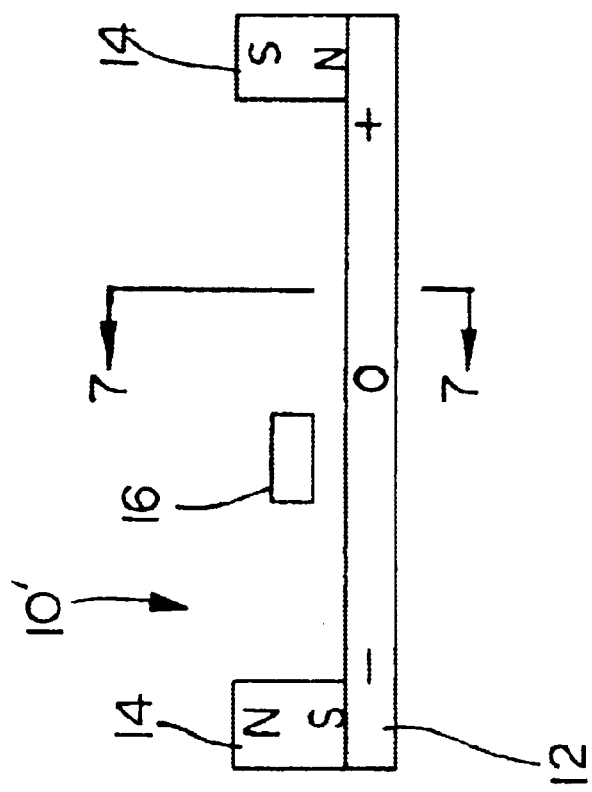
FIG. 6 is a side view in sectionalized form of another embodiment of this invention.
Figure 16:
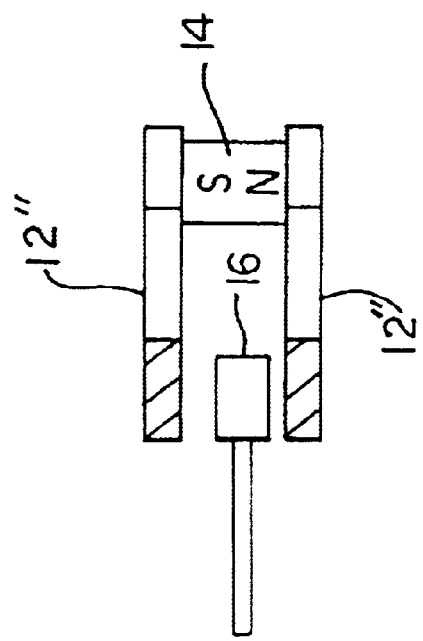
FIG. 16 is a side view in sectionalized form of the embodiment of FIG. 15.
Figure 15:
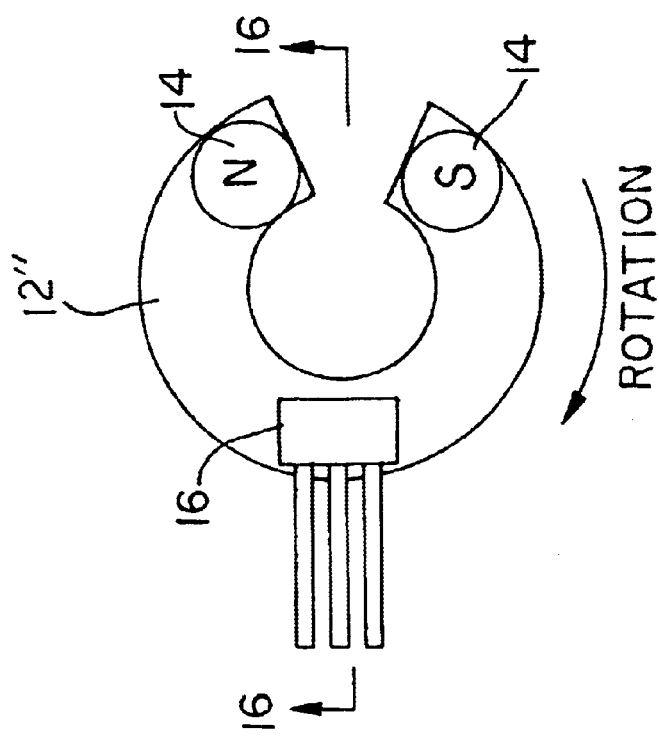
FIG. 15 is a partial top view of another embodiment of this invention showing curved plates and indicating the direction of rotation of the plates relative to the Hall effect device.
Figure 18:
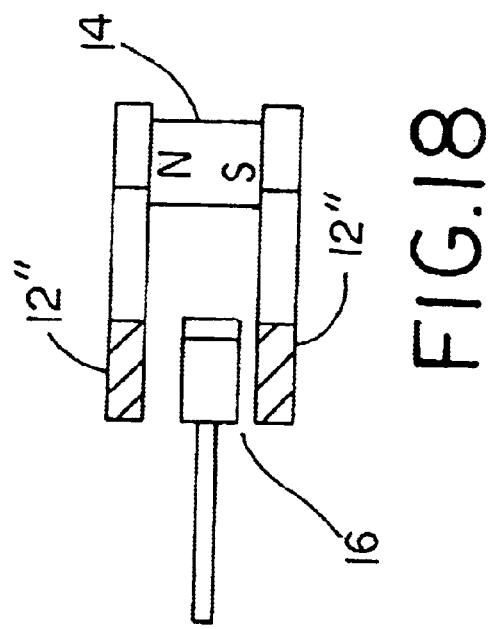
FIG. 18 is a side view in sectionalized form of the embodiment of FIG. 17.
Figure 17:
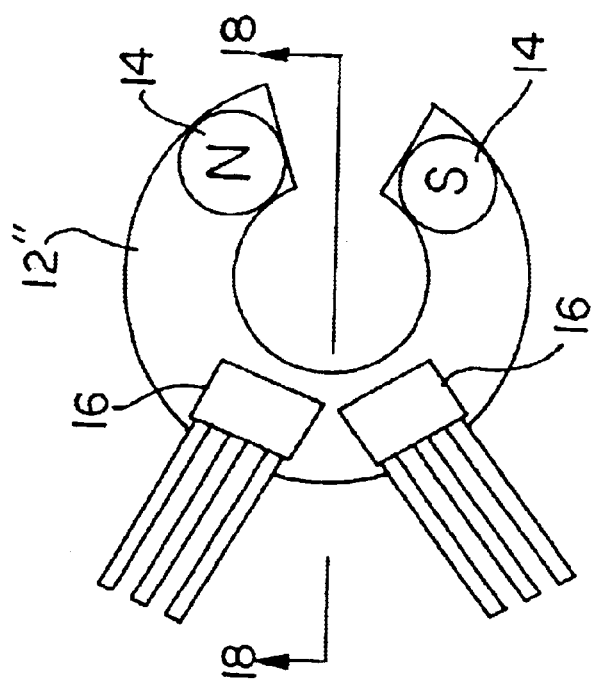
FIG. 17 is a partial top view of another embodiment similar to the embodiment of FIG. 15 but showing two Hall effect devices.
Figure 20:
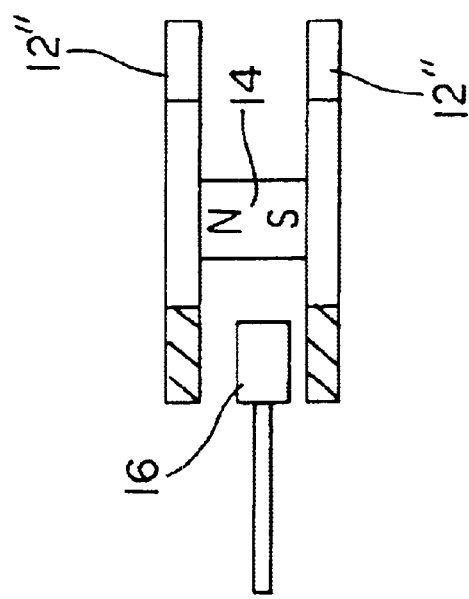
FIG. 20 is a side view in sectionalized form of the embodiment of FIG. 19.
Figure 19:
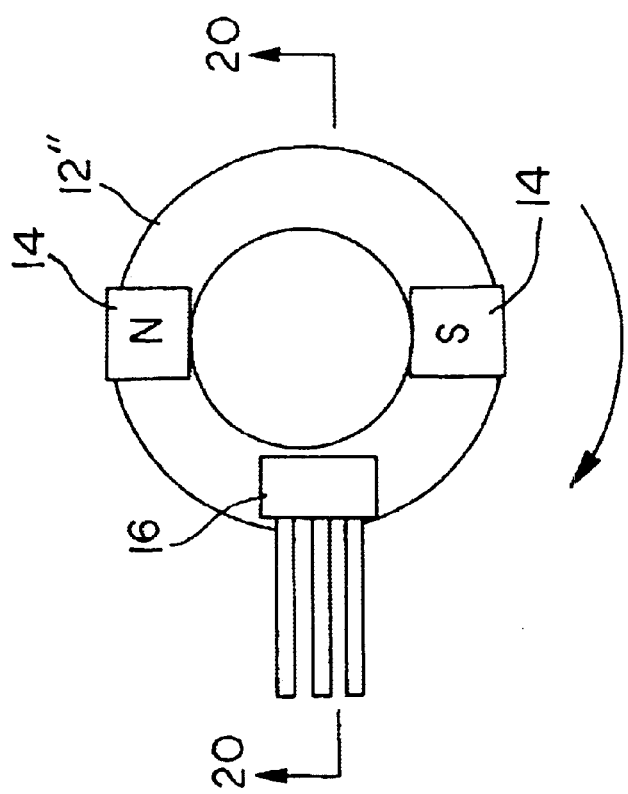
FIG. 19 is a partial top view of another embodiment of this invention showing opposed circular plates in which the direction of rotation of the plates and magnets relative to the Hall effect device is shown.
Figure 22:
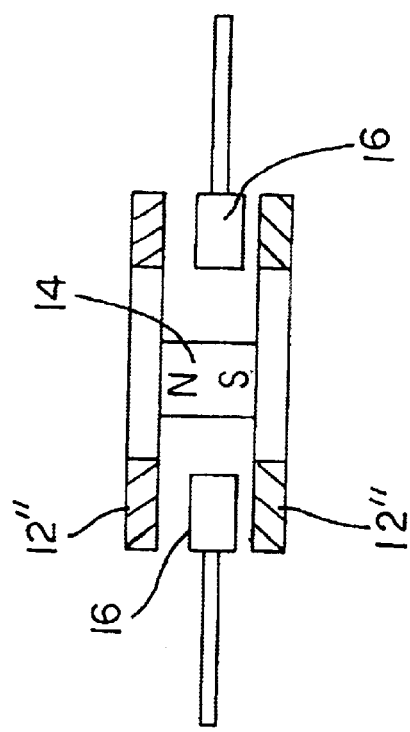
FIG. 22 is a side view in sectionalized form of the embodiment of FIG. 21.
Figure 21:
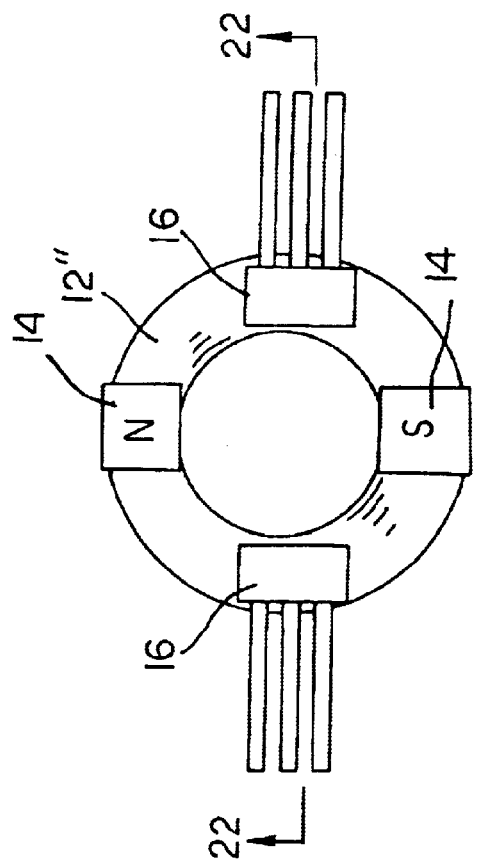
FIG. 21 is a partial top view of another embodiment similar to the embodiment of FIG. 19 but having two Hall effect devices in use.
Figure 24:
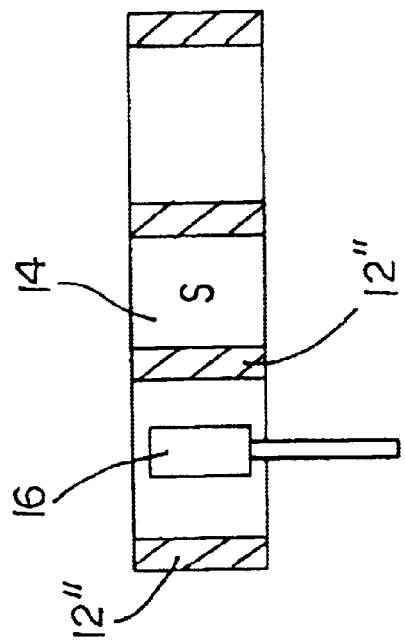
FIG. 24 is a side view in sectionalized form of the embodiment of FIG. 23.
Figure 23:
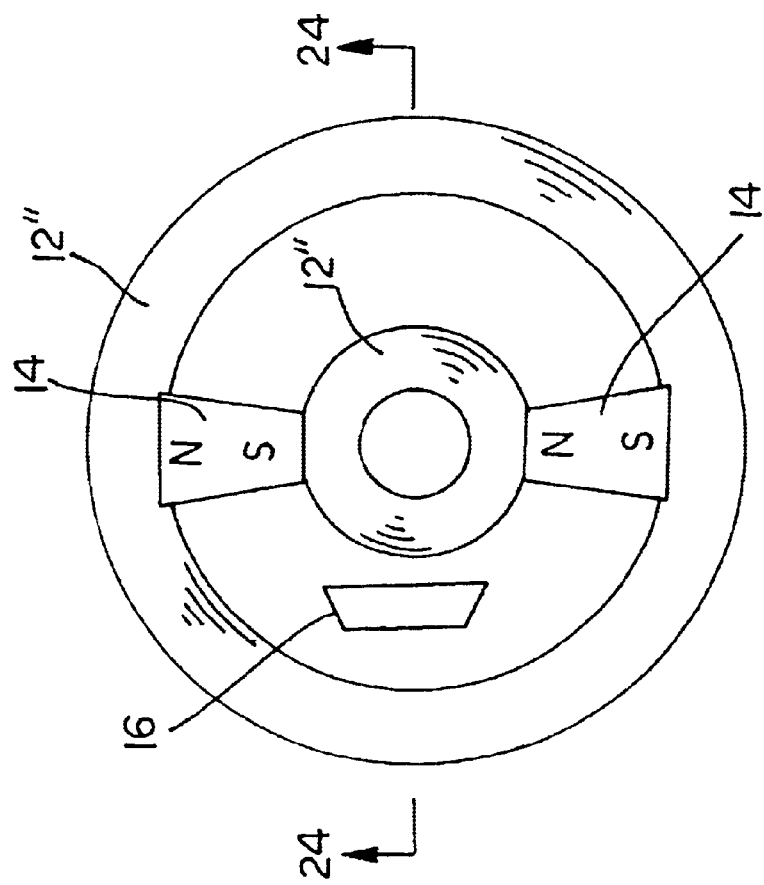
FIG. 23 is a top view of still another embodiment of this invention showing concentrically spaced plates with the direction of the rotation of the plates and connected magnets relative to the Hall effect device being illustrated.
Figure 26:
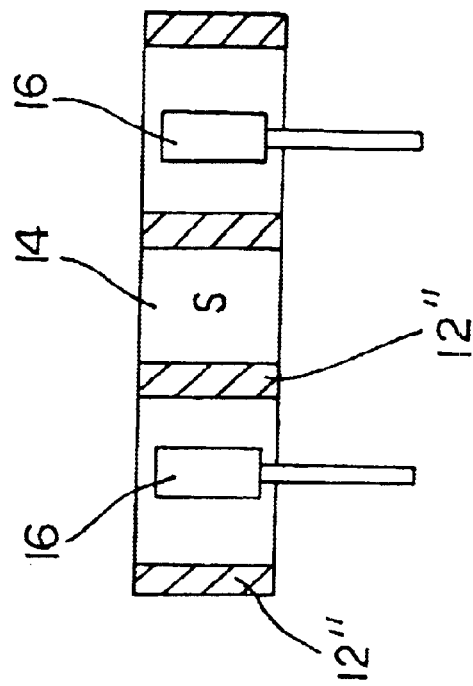
FIG. 26 is a side view in sectionalized form of the embodiment of FIG. 25.
Figure 25:
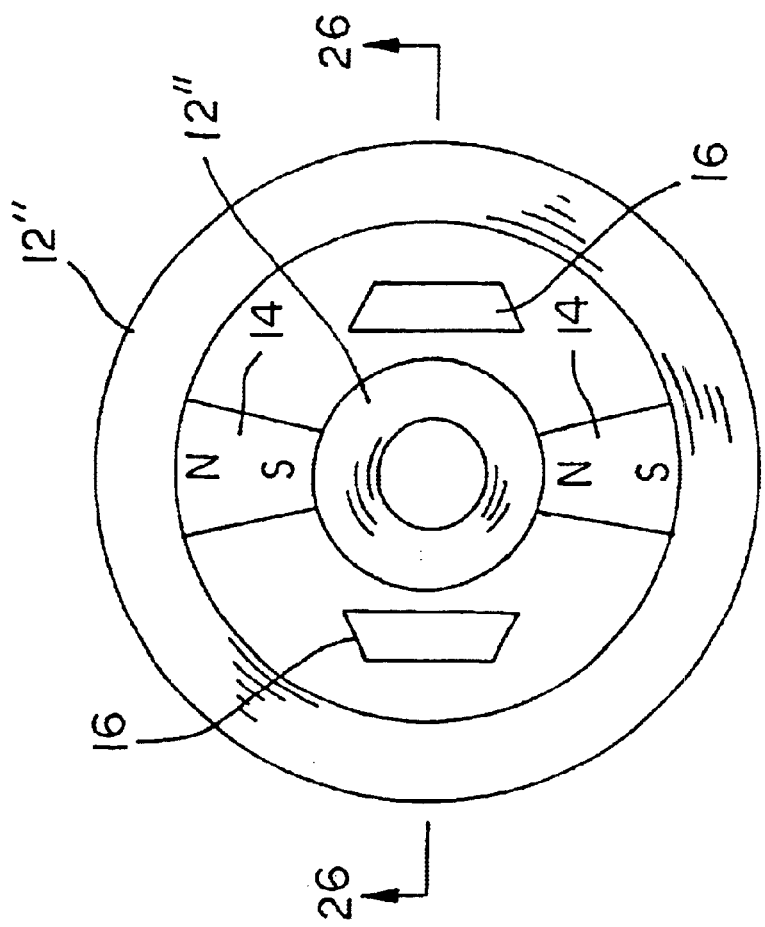
FIG. 25 is a top view of another embodiment like the embodiment of FIG. 23 but utilizing two Hall effect devices.

In FIG. 6, an alternative embodiment of the invention is shown in which only a single ferrous plate 12 is utilized in conjunction with magnets 14 and Hall effect integrated circuit 16. Ferrous plate 12 may have various configurations including being substantially flat as depicted in FIG. 6. The manner of operation of this position sensor 10' is the same as described with respect to the embodiment of FIGS. 1 and 2 with exception that only a single flux concentrator in the form of a single ferrous plate 12 is utilized. Magnets 14 may be located on either side of ferrous plate 12 or attached to the ends of ferrous plate 12.

Figure 29:
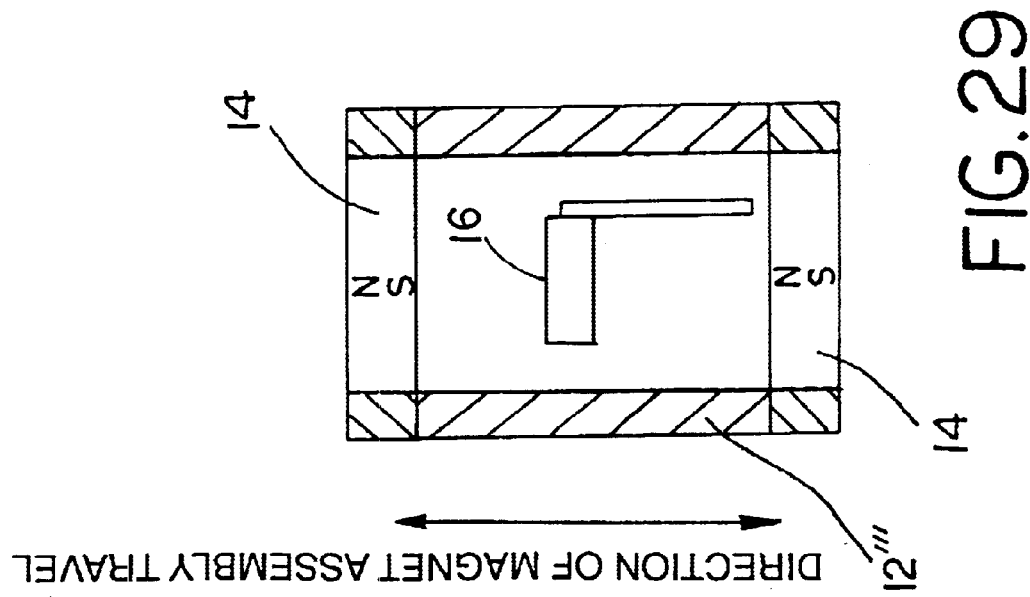
FIG. 29 is a side view in sectionalized form of a further embodiment of this invention in which the plate is of tubular form.
Figure 30:
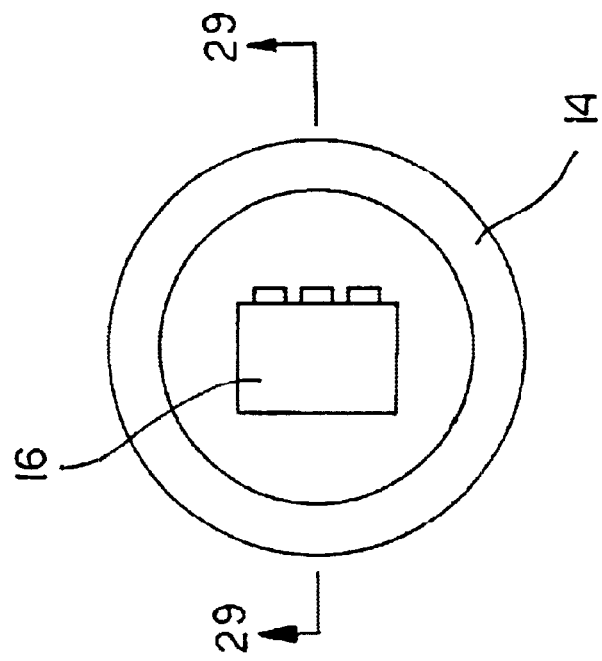
FIG. 30 is a partial top view of the embodiment of FIG. 29.

The magnetic assemblies thus far described use the illustrated straight plates 12. It is understood that the parallel ferrous plates are not required to be straight, but can be curved and will perform in the same manner as described with regard to the figures of this invention. When plates 12" are curved or circular, the position sensor will be used to sense radial movement or positions as seen in FIGS. 11–22. It is further contemplated that plate 12''', may be cylindrical as seen in FIGS. 29 and 30 or plates 12''' may be circular and concentrically orientated with magnets 14 being located at diametrically opposite locations between the spaced circular plates as seen in FIGS. 23–26. Further two or more Hall effect devices could be located between the ferrous plates to produce multiple outputs. Also the magnetic assemblies can be stacked, that is three parallel plates 12 with a Hall effect device 16 between each adjacent pair of plates having a magnet 14 at each of their ends as seen in FIGS. 27 and 28.

Although the invention as described herein utilized linear output magnetic responsive integrated circuits such as the Micronas Hal 805, it should be noted that alternative output schemes such as pulse width modulation in conjunction with a Micronas Hal 810 could also be utilized with the ferrous plates. In this scheme or embodiment, as relative movement takes place between the integrated circuit and the ferrous plates, the magnetic field strength and polarity would change with the output from the integrated circuit being a digital pulse with modulation cycling at a given frequency. The duty cycle of this digital output will have a relationship that varies in response to the magnetic field. For example, a 10 percent duty cycle from a Micronas Hal 810 would be equivalent to the linear output of 0.5 volts while a 90 percent duty cycle would be the equivalent to a linear output of 4.5 volts.

FIGS. 8 and 9 are illustrative of a third embodiment in which plates 12' are of a variable width W. In this position sensor 10" a magnet 14 is located at each end of the plates 12' and the Hall effect integrated circuit 16 is positioned between the plates. By varying the width of the ferrous plates, the slope of the output of the integrated circuit is changed as indicated by slope 26 in the graph of FIG. 10. The constant linear line, as produced by the embodiments of FIGS. 1–6 with respect to the position of the integrated circuit relative to plates 12', has a slope that varies depending upon the configuration or the width of the plates.

The position sensors are constructed with the magnet assemblies, that is plates 12, 12' and magnets 14, being shiftable or movable relative to the fixed Hall effect integrated circuit 16 through a suitable mechanical interconnection which connects the magnetic assembly to a mounted device such as the previously mentioned foot pedal, throttle positioner, EGR valve, or headlights leveler.

Now, additionally referring to FIGS. 31 through 34, there is shown a linear position sensor 50 including ferrous plates 52 and 54; magnets 56, 58, 60 and 62; and magnetic flux responsive device 16.

Ferrous plates 52 and 54 are spaced apart and arranged in a substantially parallel manner. Sufficient space exists between ferrous plates 52 and 54 to allow free movement of magnetic flux responsive device 16 therebetween. Magnet 56 is located with its north pole proximate one end of ferrous plate 52, and magnet 58 is located with its south pole proximate another end of ferrous plate 52. In a similar manner magnet 60 is located with its north pole proximate one end of ferrous plate 54, and magnet 62 is located with its south pole proximate another end of ferrous plate 54. Ferrous plates 52 and 54 are then arranged such that magnets 56 and 62 are located at the same end of linear position sensor 50, and in a like manner magnets 58 and 60 are located at an other end of linear position sensor 50.

Magnetic flux responsive device 16 may move beyond either end of ferrous plates 52 and 54, yet positional information from magnetic flux responsive device 16 is available as it traverses the length of ferrous plates 52 and 54. Such an arrangement alternatively allows multiple ferrous plate/magnet assemblies to exist in a spaced series arrangement thereby allowing locally accurate positional information to be obtained. While magnetic flux responsive device 16 is positioned between ferrous plates 52 and 54 the magnetic flux detected therebetween is substantially proportional to the relative linear position of ferrous plates 52 and 54, and magnetic flux responsive device 16. Magnetic flux responsive device 16 produces an electrical signal which relates to the detected magnetic flux, the electrical signal being available to other circuitry for the positional control of a device, not illustrated.

Figure 32:
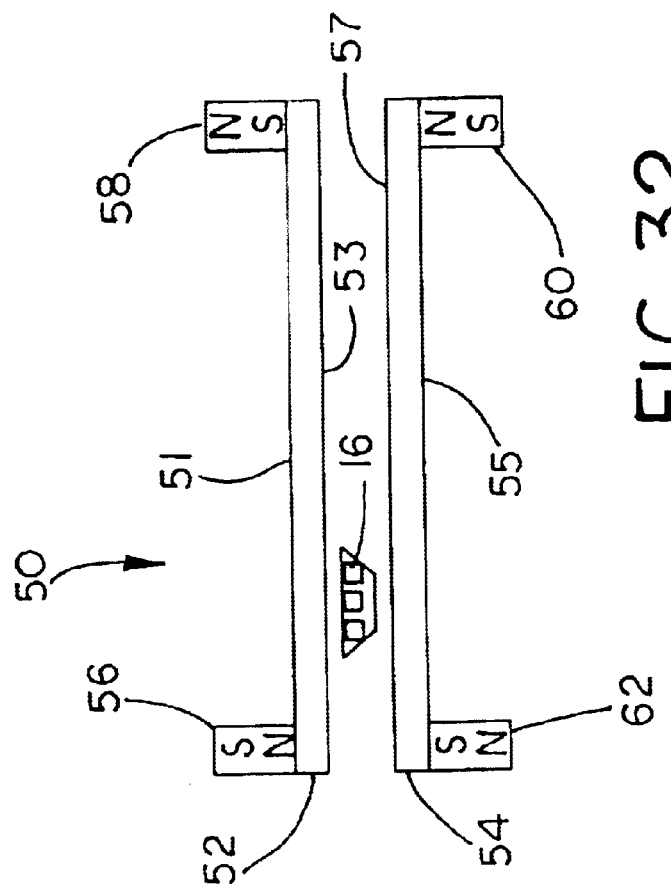
FIG. 32 is a front view of the positional sensor of FIG. 31.
Figure 31:
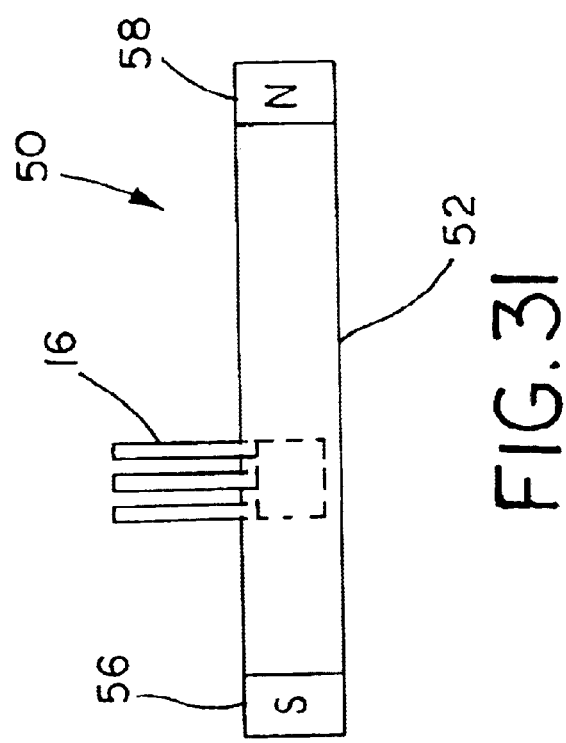
FIG. 31 is a schematic representation of the top view of yet another embodiment of a positional sensor of the present invention.

In FIG. 32, ferrous plate 52 is shown with a first side 51 and a second side 53 and ferrous plate 54 is illustrated with a first side 55 and a second side 57. Magnets 56 and 58 are located on first side 51 of ferrous Plate 52 and magnets 60 and 62 are located on first side 55 of ferrous plate 54. Magnetic flux responsive device 16 is more closely positioned proximate to second sides 53 and 57 of ferrous plates 52 and 54, respectively, than to first sides 51 and 55, and magnets 56, 58, 60 and 62. This advantageously provides for a more uniform flux concentration since magnets 56, 58, 60 and 62 are on different sides of ferrous plates 52 and 54 from magnetic flux responsive device 16, as shown in FIG. 32.

Figure 34:
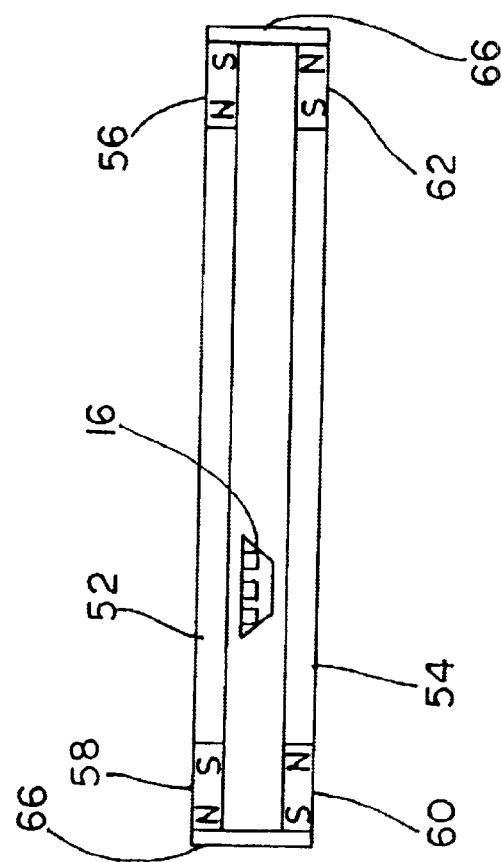
FIG. 34 is a front view of the positional sensor of FIG. 33.
Figure 33:
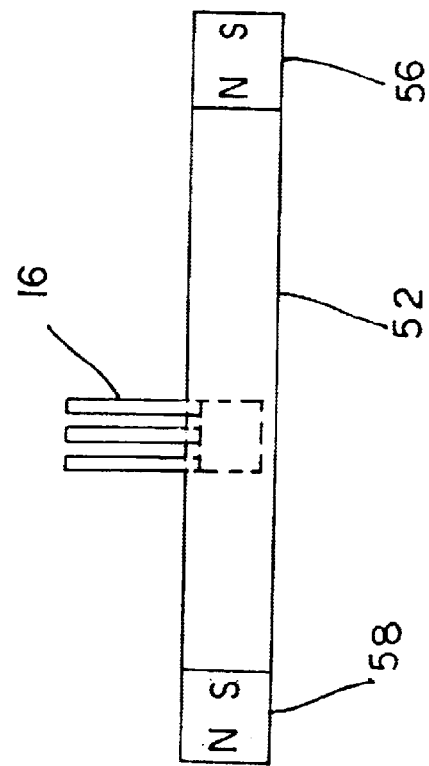
FIG. 33 is a schematic representation of the top view of yet another embodiment of a positional sensor of the present invention.

Optionally, as shown in FIG. 34, shunts 66 may be positioned to intensify the magnetic field in ferrous plates 52 and 54. Shunts 66 can be configured such that magnetic flux responsive device 16 would still be able to travel beyond the end of ferrous plates 52 and 54.

Figure 35:
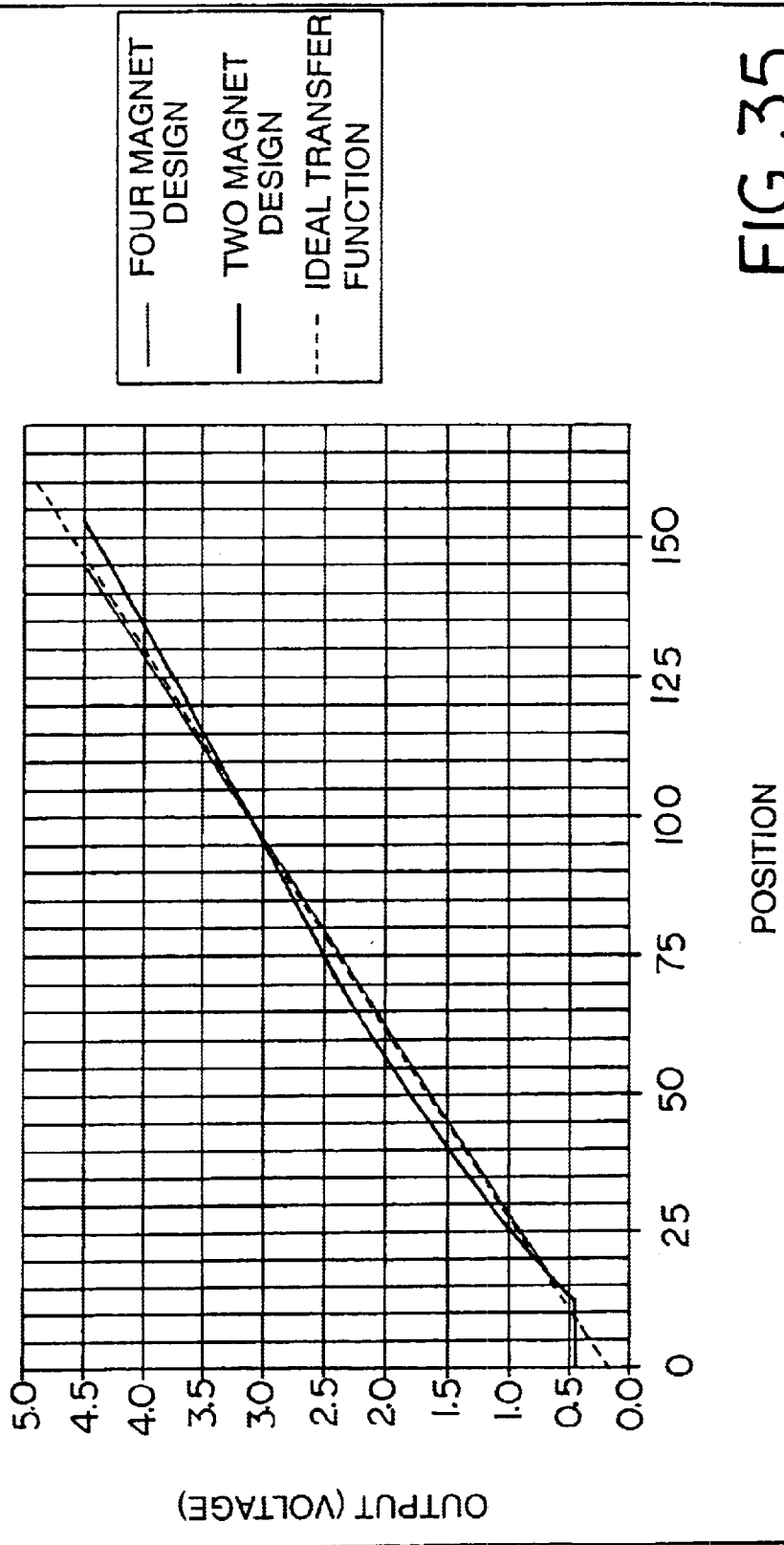
FIG. 35 is a graph showing in the horizontal axis the position of a magnetic flux responsive device and in the vertical axis a voltage output of the magnetic flux responsive device for a configuration of the present invention illustrated in FIGS. 2–3 and a configuration of the present invention illustrated in FIGS. 31–34.

An advantage of the embodiment illustrated in FIGS. 31 through 34 is that a more linear output response is generated than the configuration illustrated in FIGS. 1–3. Both the 'two magnet design' of FIGS. 1–3 and the 'four magnet design' of illustrated in FIGS. 31–34 were tested relative to an ideal transfer function. The results of the test are illustrated in FIG. 35, which shows a nearly ideal response by the 'four magnet design', while the two magnet design deviates from the ideal transfer function.

Figure 37:
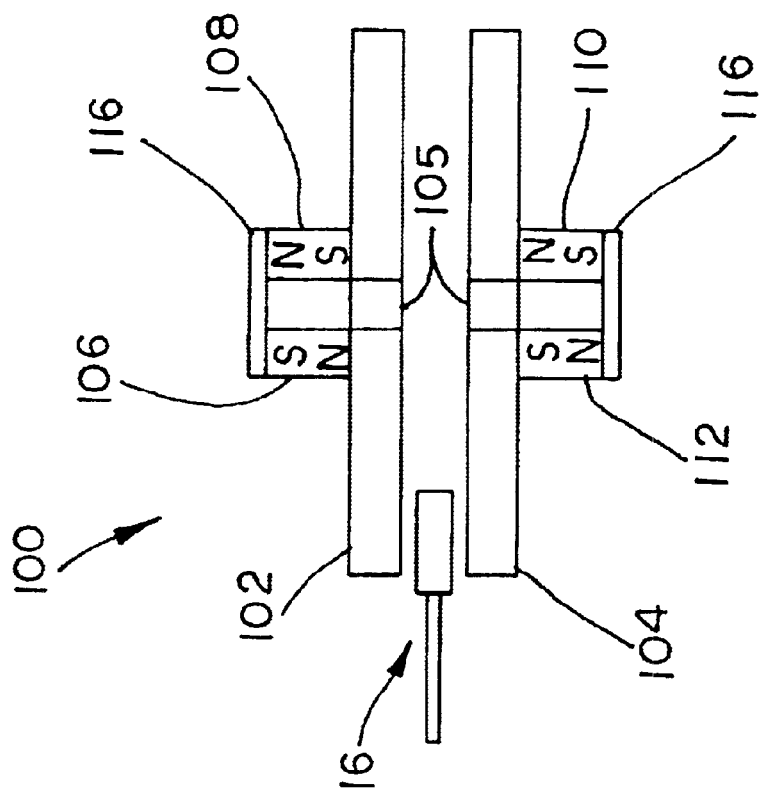
FIG. 37 is a front view of the positional sensor of FIG. 36.
Figure 36:
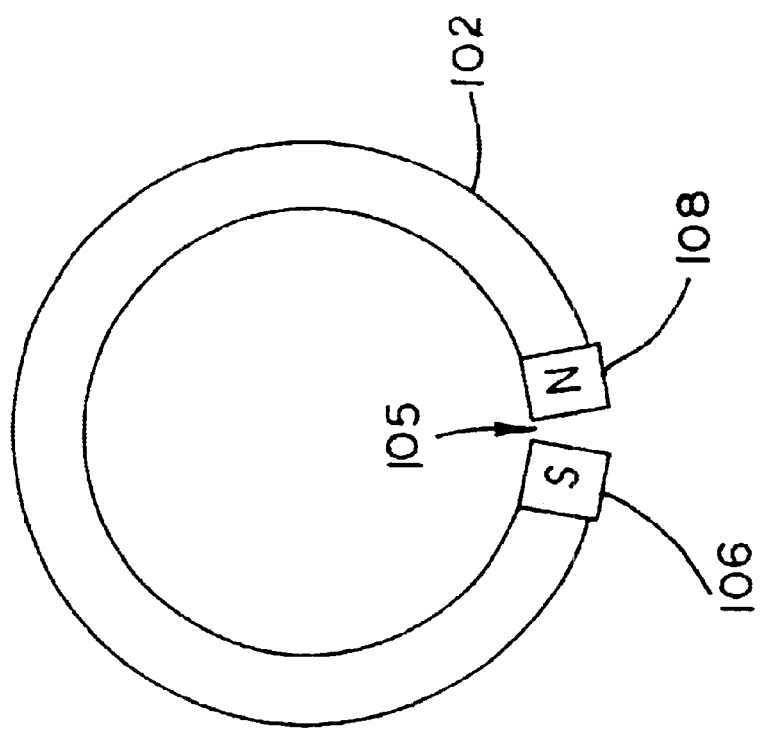
FIG. 36 is a schematic representation of the top view of a portion of yet another embodiment of a positional sensor of the present invention.

Now, additionally referring to FIGS. 36 and 37, there is shown another embodiment of the present invention, in the form of a radial position sensor 100 including ferrous plates in the form of ferrous rings 102 and 104; magnets 106, 108, 110 and 112; and magnetic flux responsive device 16.

Ferrous rings 102 and 104 are made of a ferrous material with an air gap 105 in each ring. Ferrous rings 102 and 104 are spaced apart and arranged in a substantially parallel manner. Air gap 105 of both ring 102 and 104 are disposed at substantially the same angular position. Sufficient space exists between ferrous rings 102 and 104 to allow free movement of magnetic flux responsive device 16 therebetween. Magnet 106 is located with its north pole proximate one end of ferrous ring 102 and magnet 108 is located with its south pole proximate another end of ferrous ring 102. In a similar manner magnet 110 is located with its north pole proximate one end of ferrous ring 104 and magnet 112 is located with its south pole proximate another end of ferrous ring 104. Ferrous rings 102 and 104 are then arranged such that magnets 106 and 112 are located opposite each other, and in a like manner magnets 108 and 110 are located opposite each other.

Magnetic flux responsive device 16 is positioned between ferrous rings 102 and 104. Ferrous rings 102 and 104 rotate about an axis causing the magnetic field to vary in the vicinity of magnetic flux responsive device 16. Magnetic flux responsive device 16 detects the variation of the magnetic field and outputs an electrical signal, which is dependant upon the magnetic field strength. The electrical signal is then interpreted as a radial position of ferrous rings 102 and 104.

Optionally, as shown in FIG. 37, at least one shunt 116 may be used to intensify the magnetic field in ferrous rings 102 and 104. Shunts 116 are made of a ferrous material or a material which has a magnetic permeability which varies relative to temperature such as a copper-nickel alloy.

Now, additionally referring to FIGS. 38 through 41, there is shown another embodiment of the present invention, in the form of a radial position sensor 120 including ferrous plates in the form of ferrous rings 102 and 104; magnets 122 and 124; and magnetic flux responsive device 16.

Ferrous rings 102 and 104 are made of a ferrous material with an air gap 105 in each ring. Ferrous rings 102 and 104 are spaced apart and arranged in a substantially parallel manner. Air gap 105 is either traversed on the outside of rings 102 and 104 by magnets 122 and 124 as shown in FIG. 39, or magnets 122 and 124 substantially fill air gap 105 as shown in FIG. 41.

Figure 39:
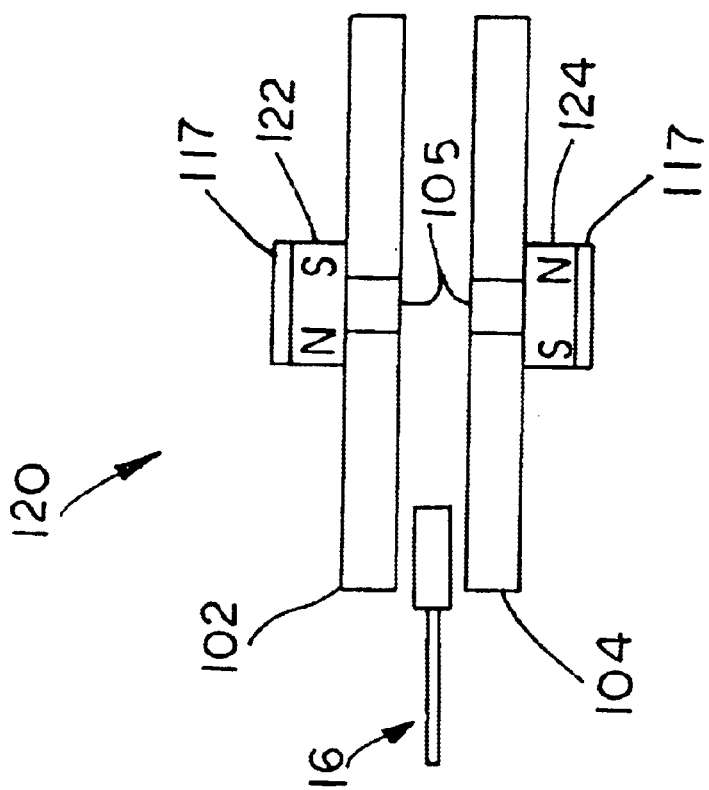
FIG. 39 is a front view of the positional sensor of FIG. 38.
Figure 38:
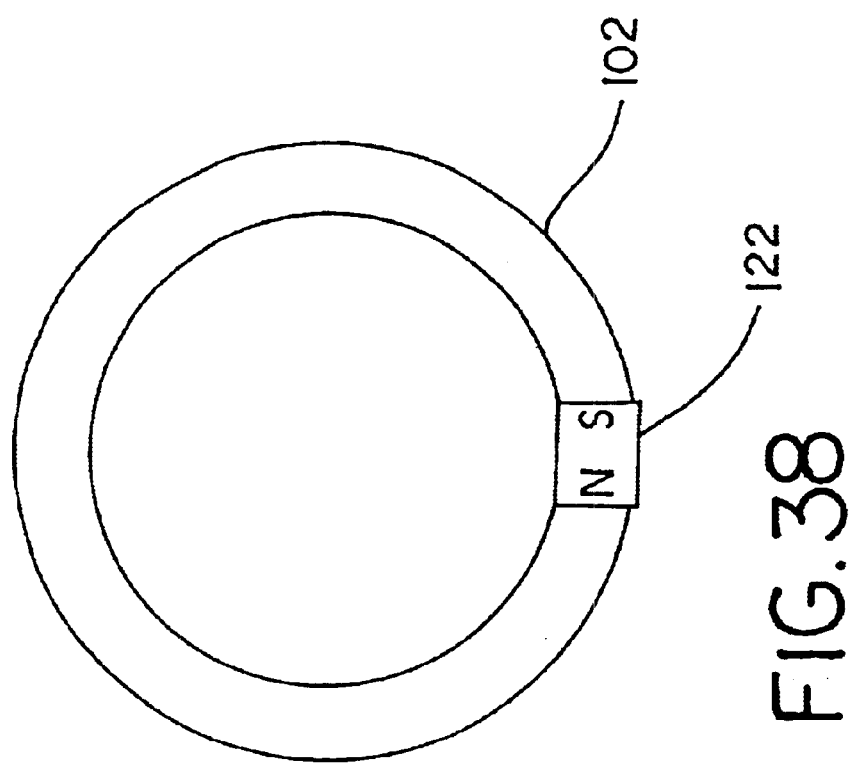
FIG. 38 is a schematic representation of the top view of a portion of yet another embodiment of a positional sensor of the present invention.
Figure 41:
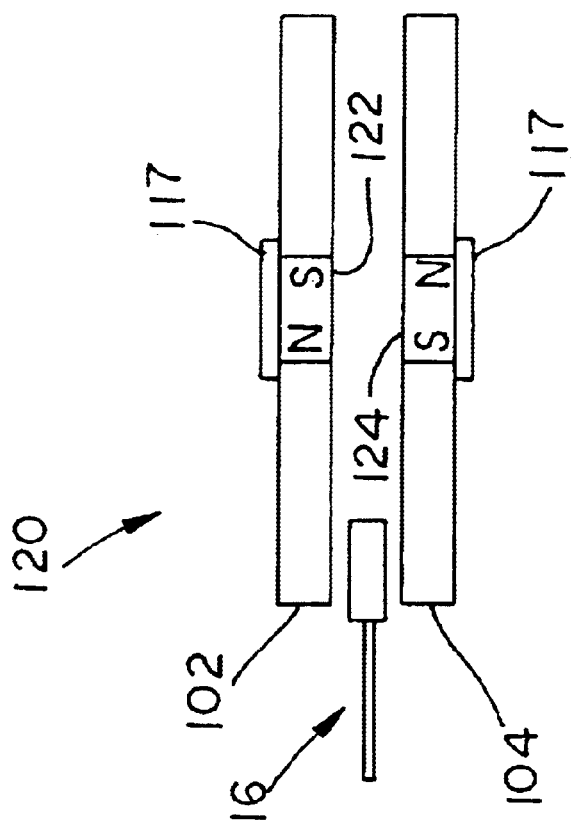
FIG. 41 is a front view of the positional sensor of FIG. 40.
Figure 40:
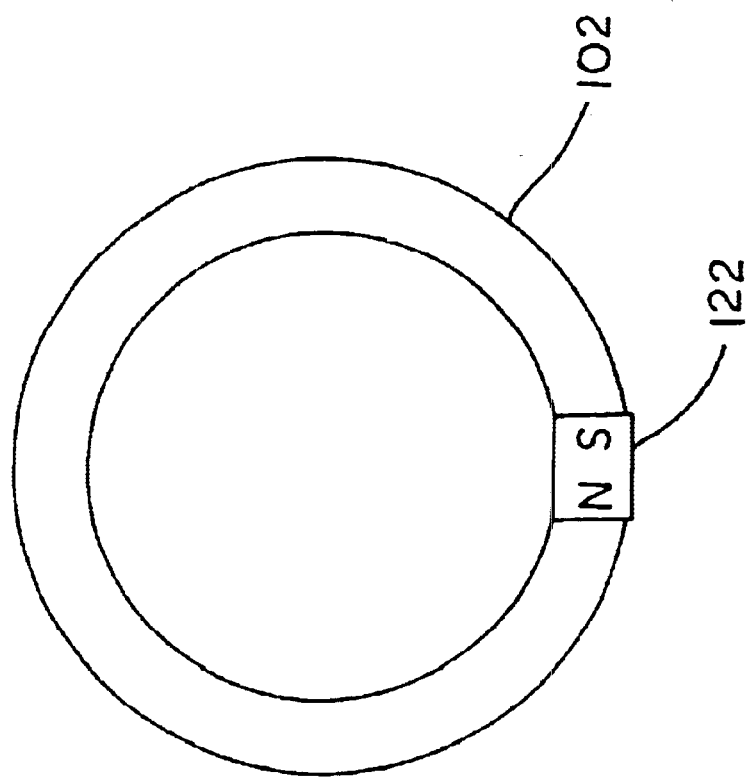
FIG. 40 is a schematic representation of the top view of a portion of yet another embodiment of a positional sensor of the present invention.

Optionally, as shown in FIGS. 39 and 41, at least one shunt 117 may be positioned to mitigate the magnetic field in ferrous rings 102 and 104. Shunts 117 can be made of a ferrous material or a material which has a magnetic permeability which varies relative to temperature such as a copper-nickel alloy. The use of a temperature sensitive magnetic permeability shunt compensates for variations in temperature, keeping the magnetic field strength between rings 102 and 104 more uniform through temperature variations.

The embodiments of the present invention, illustrated in FIGS. 36 through 41, allow a continuous rotation of ferrous rings 102 and 104 relative to magnetic flux responsive device 16. When magnetic flux responsive device 16 is proximate air gap 105, the magnetic field is at its strongest and the change in the magnetic field is not as uniform as in other areas of the space between rings 102 and 104. As air gap 105 is moved past magnetic flux responsive device 16 the direction of the magnetic flux rapidly switches. This can advantageously be used to provide an electrical output, from magnetic flux responsive device 16, which indicates an indexed output.

Alternatively, ferrous rings 102 and 104 may be segmented, having multiple air gaps, with magnets disposed at each air gap as described in the foregoing embodiments. Further, the air gaps of each segment of ferrous ring 102 may be angularly positioned relative to the air gaps in ferrous ring 104 to produce a particular electrical waveform from magnetic flux responsive device 16 as rings 102 and 104 rotate relative to magnetic flux responsive device 16.

Ferrous plates 12 and rings 102 and 104 can be formed in varying widths, as shown in FIG. 8, and may be of varying thickness and shaped to vary the distance between plates 12' and between rings 102 and 104. Each variation in thickness, width and shape is used to purposely alter the electrical output of magnetic flux responsive device 16.

Alternatively, two or more magnetic flux responsive devices 16 can be positioned at particular radial positions relative to ferrous rings 102 and 104. The electrical output from magnetic flux responsive devices 16 is conditioned by circuitry, which use output signals from magnetic flux responsive devices 16, during the portion of rotation in which a particular magnetic flux responsive device 16 is located away from air gap 105.

In yet another alternative form, ferrous rings 102 and 104 may be cylindrical of differing diameters with one cylindrical ring fitting inside the other with a space therebetween sufficient for the locating of magnetic flux responsive device 16. Cylindrical ferrous rings 102 and 104 each have an air gap along the length thereof Magnets, configured as in the forgoing embodiments, provide a magnetic field to cylindrical ferrous rings 102 and 104.

In yet another alternative configuration, more than one radial position sensor 100 or 120 are located coaxially, thereby providing multiple output signals to external circuitry, which process the multiple outputs to determine the radial position, velocity or acceleration of a target object such as a shaft.

What is claimed is:

1. A position sensor for sensing linear or radial position, comprising:

at least for magnets, each of said at least four magnets producing a magnetic flux;

a first ferrous plate including a first side and a second side, said first ferrous plate having two of said at least four magnets located along said first side at spaced locations along said first ferrous plate, said two magnets being oriented such that a north pole of one of said two magnets is directed toward said first ferrous plate and a south pole of an other of said two magnets is directed toward said first ferrous plate;

a second ferrous plate including a first side and a second sides said second ferrous plate having an other two of said at least four magnets located along said first side at spaced locations along said second ferrous plate, said two magnets being oriented such that a north pole of one of said two magnets is directed toward said second ferrous plate end a south pole of an other of said two magnets is directed toward said second ferrous plate, said first ferrous plate and said second ferrous plate being generally parallel and spaced apart; and at least one magnetic flux responsive device disposed between said second side of said first ferrous plate and said second side of said second ferrous plate, said at least one magnetic flux responsive device at least partially responsive to said magnetic flux from said at least four magnets.

2. A The position sensor of claim 1, wherein said magnetic flux responsive device is at least one of a Hall effect device and a programmable Hall effect device.

3. The position sensor of claim 1, further comprises at least one magnetic shunt disposed proximate to at least two of said at least four magnets, such that said at least one magnetic shunt shunts said magnetic flux.

4. The position sensor of claim 1, wherein said first ferrous plate and said second ferrous plate are both generally shaped as one of circular and cylindrical, said first ferrous plate being discontinuous thereby defining an air gap and said second ferrous plate being discontinuous thereby defining an air gap.

5. The position sensor of claim 1, wherein said at least one magnetic flux responsive device is configured to traverse beyond said first ferrous plate end said second ferrous plate.

6. The position sensor of claim 1, wherein at least one of said first ferrous plate and said second ferrous plate varies in at least one of width, thickness and shape.

7. A position sensor for sensing radial position, comprising:

two magnets each producing a magnetic flux, said two magnets including a first magnet and a second magnet;

two ferrous plates being generally shaped as one of circular and cylindrical, each said ferrous plate having an air gap, said two ferrous plates including a first ferrous plate and a second ferrous plate, said first magnet being coupled to said first ferrous plate, said first magnet being oriented with a north pole disposed toward an end of said air gap in said first ferrous plate soda south pole disposed toward an other end of said air gap, said second magnet being coupled to said second ferrous plate, said second magnet being oriented with a north pole disposed toward an end of said air gap in said second ferrous plate, and a south pole disposed toward an other end of said air gap, said first ferrous plate and said second ferrous plate being generally parallel and spaced apart; and at least one magnetic flux responsive device disposed between said first ferrous plate and said second ferrous plate, said at least one magnetic flux responsive device at least partially responsive to said magnetic flux from said two magnets.

8. The position sensor of claim 7, wherein said magnetic flux responsive device is at least one of a Hall effect device and a programmable Hall effect device.

9. The position sensor of claim 7, further comprising at least one magnetic shunt disposed proximate to at least one of said two magnets, such that said at least one magnetic shunt shunts said magnetic flux of at least one of said two magnets.

10. The position sensor of claim 7, wherein said north pole of said first magnet is generally directed in a direction contra to said north pole of said second magnet.

11. The position sensor of claim 7, wherein at least one of said two ferrous plates varies in at least one of width, thickness and shape.

12. The position sensor of claim 7, wherein said at least one magnetic flux responsive device produces an electrical signal relative to the sensed magnetic flux density.

13. A method for waking and installing a device for sensing one of linear and radial position, comprising:

spacing a first ferrous plate and a second ferrous plate apart in a generally parallel manner;

orienting two magnets toward said first ferrous plate and two additional magnets toward said second ferrous plate such that a north pole of one said magnet and a south pole of an other said magnet are directed toward said first ferrous plate and a north pole of yet an other said magnet and a south pole of still yet another magnet is directed toward said second ferrous plate;

positioning a magnetic flux responsive device between said first ferrous plate and said second ferrous plate such that movement of said magnetic flux responsive device relative to said first ferrous plate and said second ferrous plate alters the magnetic field in said magnetic flux responsive device said magnetic flux responsive device being closer to said first ferrous plate and said second ferrous plate than to said two magnets; and mounting said ferrous plates to a structure including one of a foot pedal, a throttle, an EGR valve, a shall and a headlight leveling system, and said magnetic flux responsive device on an other structure, said magnetic flux responsive device and said ferrous plates configured to move relative to each other.

* * * * *

UNITED STATES PATENT AND TRADEMARK OFFICE
CERTIFICATE OF CORRECTION

PATENT NO. : 6,753,680 B2
DATED : June 22, 2004
INVENTOR(S) : Wolf

It is certified that error appears in the above-identified patent and that said Letters Patent is hereby corrected as shown below:

Column 4,
Line 45, please delete "preferably," and substitute therefore-- preferably --.

Column 9,
Line 15, please delete "sides" and substitute therefore -- sides, --; and
Line 20, please delete "end" and substitute therefore -- and --.

Column 10,
Line 2, please delete "soda" and substitute therefore -- and a --;
Line 6, please delete "plate," and substitute therefore -- plate --; and
Line 33, please delete "waking" and substitute therefore -- making --.

Signed and Sealed this

Fifth Day of April, 2005

JON W. DUDAS
*Director of the United States Patent and Trademark Office*